United States Patent [19]

Atherton, Jr. et al.

[11] Patent Number: 5,371,511
[45] Date of Patent: Dec. 6, 1994

[54] METHOD FOR APPROXIMATING THE NOTION OF A ROTATABLE DISK OF AN ELECTRICAL ENERGY METER

[75] Inventors: Kenneth W. Atherton, Jr., Saco, Me.; Gregory P. Lavoie, Lee, N.H.

[73] Assignee: General Electric Company, Schenectady, N.Y.

[21] Appl. No.: 864,193

[22] Filed: Apr. 3, 1992

Related U.S. Application Data

[63] Continuation of Ser. No. 634,668, Dec. 27, 1990, abandoned.

[51] Int. Cl.$^5$ .................................................. G09G 3/20
[52] U.S. Cl. .................................................. 345/38; 345/33
[58] Field of Search ............ 340/752, 754, 753, 756, 340/791, 793, 870.01, 870.02, 765, 636, 637; 324/115, 157, 142; 364/483; 345/33, 34, 38, 39, 50, 56

[56] References Cited

U.S. PATENT DOCUMENTS

| | | | |
|---|---|---|---|
| 4,198,810 | 4/1980 | Fahrenschon | 340/765 |
| 4,203,103 | 5/1980 | Osada et al. | 340/753 |
| 4,271,410 | 6/1981 | Crawford | 340/765 |
| 4,283,772 | 8/1981 | Johnston | 364/900 |
| 4,298,839 | 11/1981 | Johnston | 324/157 |
| 4,686,460 | 8/1987 | Stevens et al. | 324/142 |
| 4,751,546 | 6/1988 | Yanamoto et al. | 354/468 |
| 4,902,964 | 2/1990 | Szabela et al. | 324/103 |
| 4,902,965 | 2/1990 | Bodrug et al. | 324/116 |
| 4,973,901 | 11/1990 | Balch | 324/142 |

OTHER PUBLICATIONS

Landris & Gyr, SSM-20, 1986.
Landis & Gyr, PDR-A Programmable Demand Register, 1987.
Landis & Gyr, CTR, 1990.

*Primary Examiner*—Alvin E. Oberley
*Assistant Examiner*—Chanh Nguyen
*Attorney, Agent, or Firm*—Bell, Seltzer, Park & Gibson

[57] ABSTRACT

Simulated meter disk rotation is provided in an electronic power meter which does not include a meter disk to enable meter timing and testing to be accomplished in the same visual manner as the use of the disk in an electro-mechanical power meter. The existing segmented character display is used to provide a simulated gap in which horizontal display segments move and appear to wrap around the rear of the meter.

10 Claims, 9 Drawing Sheets

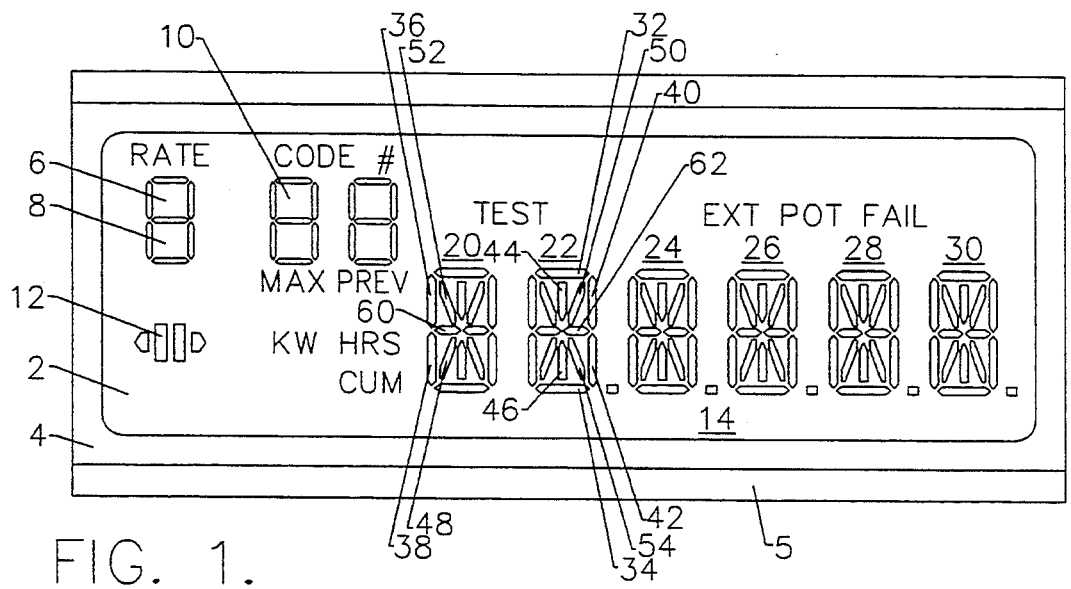
FIG. 1.
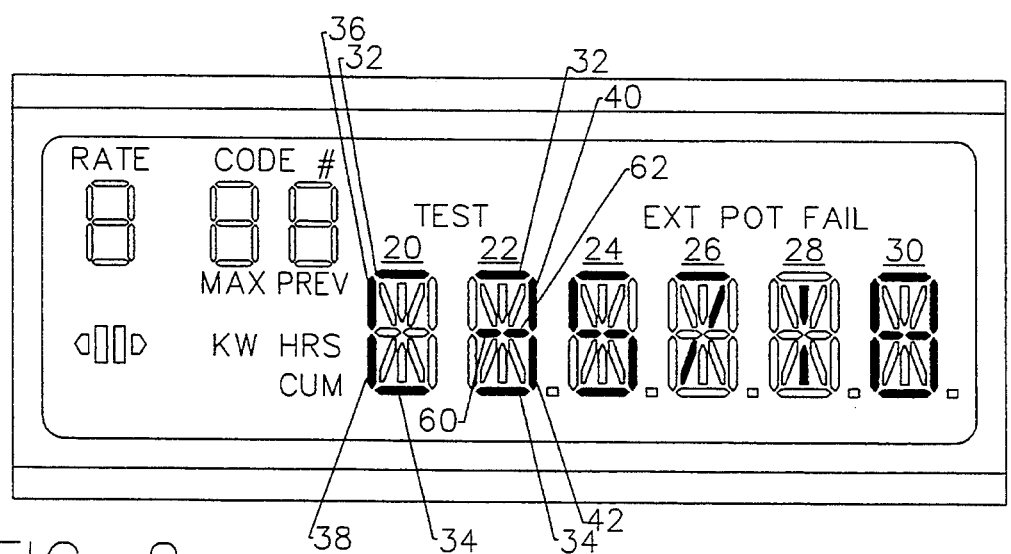
FIG. 2.
```
ADDRESS  31        27        23                                         0
         0000 0000 0000 0000 0000 0000 0000 0000
         0000 0000 0000 0000 0000 0000 0000 0000
         0000 0000 0000 0000 0000 0000 0000 0000
         0000 0000 0000 0000 0000 0000 0000 0000
```
FIG. 3.

STATE 1
```
0000 0000 0100 0100 0100 0100 0100 0100
0000 0000 1000 1000 0000 0000 0000 0000
0000 0000 0001 0000 0000 0000 0000 0000
0000 0000 0010 0010 0010 0010 0010 0010
```
FIG. 4a.

STATE 2
```
0000 0000 0100 0100 0100 0100 0100 0100
0000 0000 0000 1000 0000 0000 0000 0000
0000 0000 0001 0001 0000 0000 0000 0000
0000 0000 0010 0010 0010 0010 0010 0010
```
FIG. 4b.

STATE 3
```
0000 0000 0100 0100 0100 0100 0100 0100
0000 0000 0000 1000 1000 0000 0000 0000
0000 0000 0000 0001 0000 0000 0000 0000
0000 0000 0010 0010 0010 0010 0010 0010
```
FIG. 4c.

STATE 4
```
0000 0000 0100 0100 0100 0100 0100 0100
0000 0000 0000 0000 1000 0000 0000 0000
0000 0000 0000 0001 0001 0000 0000 0000
0000 0000 0010 0010 0010 0010 0010 0010
```
FIG. 4d.

STATE 5
```
0000 0000 0100 0100 0100 0100 0100 0100
0000 0000 0000 0000 1000 1000 0000 0000
0000 0000 0000 0000 0001 0000 0000 0000
0000 0000 0010 0010 0010 0010 0010 0010
```
FIG. 4e.

STATE 6
```
0000 0000 0100 0100 0100 0100 0100 0100
0000 0000 0000 0000 0000 1000 0000 0000
0000 0000 0000 0000 0001 0001 0000 0000
0000 0000 0010 0010 0010 0010 0010 0010
```
FIG. 4f.

STATE 7
```
0000 0000 0100 0100 0100 0100 0100 0100
0000 0000 0000 0000 0000 1000 1000 0000
0000 0000 0000 0000 0000 0001 0000 0000
0000 0000 0010 0010 0010 0010 0010 0010
```
FIG. 4g.

STATE 8
```
0000 0000 0100 0100 0100 0100 0100 0100
0000 0000 0000 0000 0000 0001 1000 0000
0000 0000 0000 0000 0000 0000 0001 0000
0000 0000 0010 0010 0010 0010 0010 0010
```
FIG. 4h.

STATE 9
```
0000 0000 0100 0100 0100 0100 0100 0100
0000 0000 0000 0000 0000 0000 1000 1000
0000 0000 0000 0000 0000 0000 0001 0000
0000 0000 0010 0010 0010 0010 0010 0010
```
FIG. 4i.

STATE 10
```
0000 0000 0100 0100 0100 0100 0100 0100
0000 0000 0000 0000 0000 0000 0000 1000
0000 0000 0000 0000 0000 0000 0001 0001
0000 0000 0010 0010 0010 0010 0010 0010
```
FIG. 4j.

STATE 11
```
0000 0000 0100 0100 0100 0100 0100 0100
0000 0000 1000 0000 0000 0000 0000 1000
0000 0000 0000 0000 0000 0000 0000 0001
0000 0000 0010 0010 0010 0010 0010 0010
```
FIG. 4k.

STATE 12
```
0000 0000 0100 0100 0100 0100 0100 0100
0000 0000 1000 0000 0000 0000 0000 0000
0000 0000 0000 0001 0000 0000 0000 0001
0000 0000 0010 0010 0010 0010 0010 0010
```
FIG. 4l.

```
VOID UPDATE_DISKULATOR (DIR)
  INT DIR;
  {
  NEW_MASK=((CUR_STATE & 1)<<1)+2
  IF (DIR==FWD)
      {
      OFF_ADDR=(L_ADDR+1)-CUR_MASK;
      IF (OFF_ADDR<BASE_ADDR) OFF_ADDR+=24;
      ON_ADDR=(R_ADDR+1)-NEW_MASK;
      IF (ON_ADDR<BASE_ADDR) ON_ADDR+=24;
      NEW_STATE=CUR_STATE+1;
      IF (NEW_STATE>12) NEW_STATE-=12;
      L_ADDR = OFF_ADDR;
      R_ADDR = ON_ADDR;
      }
  ELSE/* DIR==REV*/
      {
      OFF_ADDR = R_ADDR;
      ON_ADDR = L_ADDR;
      NEW_STATE=CUR_STATE-1;
      IF (NEW_STATE<1) NEW_STATE+=12;
      L_ADDR=(ON_ADDR-1) + NEW_MASK;
      IF (L_ADDR>END_ADDR) L_ADDR-=24;
      R_ADDR=(OFF_ADDR-1) + CUR_MASK;
      IF (R_ADDR>END_ADDR) R_ADDR-=24;
      }
  /*ENDIF*/
  CMD1=OFF_ADDR 10xE0;
  CMD3=ON_ADDR 10xE0;
  CMD4=NEW_MASK 10xB0;

CUR_STATE = NEW_STATE;
  CUR_MASK = NEW_MASK;
  }
```

FIG. 12.

METHOD FOR APPROXIMATING THE NOTION OF A ROTATABLE DISK OF AN ELECTRICAL ENERGY METER

This application is a continuation of application Ser. No. 07/634,668, filed Dec. 27, 1990, now abandoned.

BACKGROUND OF INVENTION

The present invention relates to an electronic electric power meter, and more particularly to the simulation of the rotation of a power meter disk which is present in conventional electro-mechanical power meters, but which is not present in electronic power meters.

In a conventional electro-mechanical power meter, an eddy current disk is caused to rotate at a rate proportional to the power being consumed by the load being metered. Meter technicians at the factory and in the field use the rotation of the meter disk on such conventional electro-mechanical watt hour meters for timing measurements during various meter tests. Since the power meter is conventionally enclosed within a glass or plastic transparent cover, the rotation of the eddy current meter disk can be readily viewed even in an assembled power meter. A timing mark or line is conventionally provided on the outer edge of the meter disk such that it is visible at any given location exactly once per revolution of the metered disk. By counting the number of times that the timing mark or line is observed at a given location as the disk revolves for a given period of time, the number of kilowatt hour pulses that should have been accumulated by the register, which accumulates and displays power consumption, can be determined.

With the use of microprocessors in certain new designs of electronic electric power meters, pulses are derived electronically and displayed, for example, on a liquid crystal alpha-numeric display such that a rotating disk is not necessary, and is not included, in such designs. An example of an electronic power meter is described in U.S. Pat. No. 5,001,420, issued Mar. 19, 1991 by W. R. Germer, M. J. Ouellette, D. F. Bullock, and A. F. Palmer, entitled Modular Construction for Electronic Energy Meter, assigned to the same assignee as the present invention, and hereby incorporated by reference.

With such electronic power meters, an alternate method of timing must be provided for the various tests that have previously been conducted utilizing the timing mark on the meter disk. However, it is desirable that an alternate meter disk timing method for an electronic power meter not require any hardware beyond that required and provided by the existing alpha-numeric display on the register of the power meter. In addition, it is highly desirable that the alternate meter disk timing method be as easy to use for a meter technician as possible, be as accurate as the original meter disk timing method, and impose a minimum burden, or loading, on the timing and space limitations of the software used in electronic power meters. Since the meter technician is trained and familiar with the use of a moving timing mark it is highly desirable to have the alternate timing arrangement provide a simulated meter disk rotation which visually appears as close as possible to that provided by the timing mark in an electro-mechanical power meter.

The desirability of simulating the meter disk in an electronic liquid crystal display (LCD) has been addressed but not satisfactorily solved. U.S. Pat. No. 4,902,964 issued Feb. 20, 1990, describes the provision of a "caterpillar crawl" LCD segment array controlled by a microprocessor to correspond to the rotation of the rotating shuttered disk of an optical pulse initiator. The array is included in an electronic demand register in which the segments are sequentially illuminated in groups of three segments to correspond to the rotation of the shuttered disk, and in which the display is hi-directional to accommodate forward and reverse rotations of the shuttered disk. Such an arrangement requires the provision of an optical shutter disk, but more importantly requires a special "caterpillar crawl" segment array or display in the liquid crystal display. This requires a special display in addition to the normal segmented display which is selectively energized to provide alpha-numeric display characters. Such an arrangement requires special manufacturing masks for the LCD, and a special LCD display element to accommodate the "caterpillar crawl" segment array. This adds complexity and cost to the power meter. U.S. Pat. No. 4,686,460 issued Aug. 11, 1987 provides a vector whose direction indicates the direction of flow of power on the lines measured and whose length approximates the magnitude. Different signals are selected for different speeds of rotation. Such prior arrangements have not proven entirely satisfactory for the reasons indicated above and as discussed below.

It is an object of the present invention to provide an electric power meter eddy current disk rotation simulator which is familiar in appearance, and is easy to use by a meter technician.

It is another object of the present invention to provide an electric power meter eddy current disk rotation simulator which is accurate, yet imposes a minimum burden on the timing and space limitations of the software in an electronic power meter.

It is still another object of the present invention to provide an eddy current disk rotation simulator in an electronic electric power meter which uses existing alpha-numeric symbol displays without the necessity of special displays or special display manufacturing requirements.

It is a further object of the present invention to provide an eddy current disk rotation simulator in an electronic power meter which visually approximates the spinning eddy current disk of an electro-mechanical induction power meter.

It is a still further object of the present invention to provide an electric power meter eddy current disk rotation simulator which visually displays direction of rotation and energy flow.

In accordance with one embodiment of the present invention, the rotation of the eddy current disk in a conventional electro-mechanical power meter is simulated in an electronic power meter which does not include a meter disk but which includes a plurality of segmented characters for displaying power. Power consumption is displayed on the segmented characters with a time sharing arrangement to display the simulated meter disk rotation upon interruption of the display of power consumption. Horizontal display segments are produced in the center of the segmented characters, extending beyond a single segmented character, and are generated in response to pulses of the electronic power meter which vary in accordance with power consumption by the load. The horizontal display segments are caused to move across the segmented characters in response to a command signal, and to disappear in part at one end of the segmented characters while at the same time appearing at the opposite side.

The top and bottom of the horizontal segments of the segmented characters are energized to provide parallel lines during the simulation in order to simulate the gap in which the conventional electro-mechanical meter disk rotates. There are 6 segmented characters, each of which have a center of 2 segments, and 12 states are applied to correspond to the 12 pulses per revolution in a conventional power meter. The direction of movement is made responsive to the direction of energy flow relative to the load. The number of times the horizontal display segments return to the same position may be counted over a period of time to enable testing of the operation of the electronic power meter in the same manner a timing mark on the meter disk in a conventional power meter is used for counting and timing purposes.

DRAWINGS AND BRIEF DESCRIPTION OF INVENTION

FIG. 1 shows a typical electronic register display for an electric power meter.

FIG. 2 shows how the energization of selected segments of the alpha-numeric display of FIG. 1 as used to provide alpha-numeric readouts.

FIG. 3 illustrates the LCD controller display random access memory (RAM) layout area.

FIG. 4(a)–4(l) shows the memory contents of the LCD controller RAM of FIG. 3 for each state of the present invention.

FIG. 5(a)–5(l) shows the energization of the alpha-numeric displays for each of the 12 states shown in FIG. 4.

Figure 6:
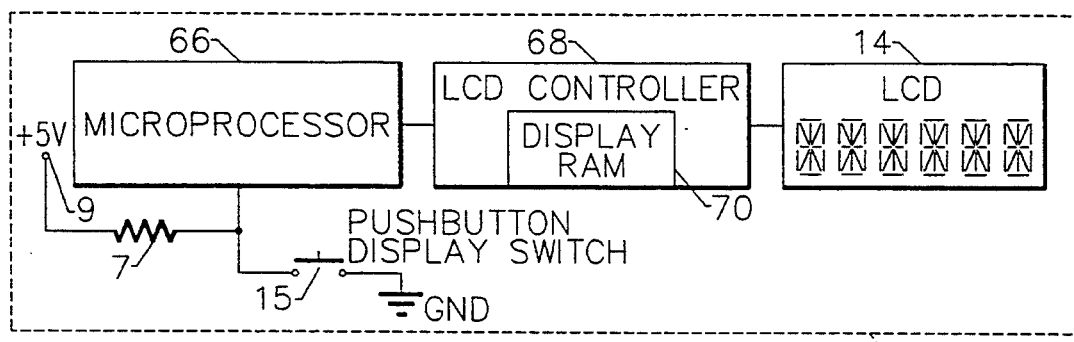

FIG. 6 is a block diagram showing the invention.

Figure 7:
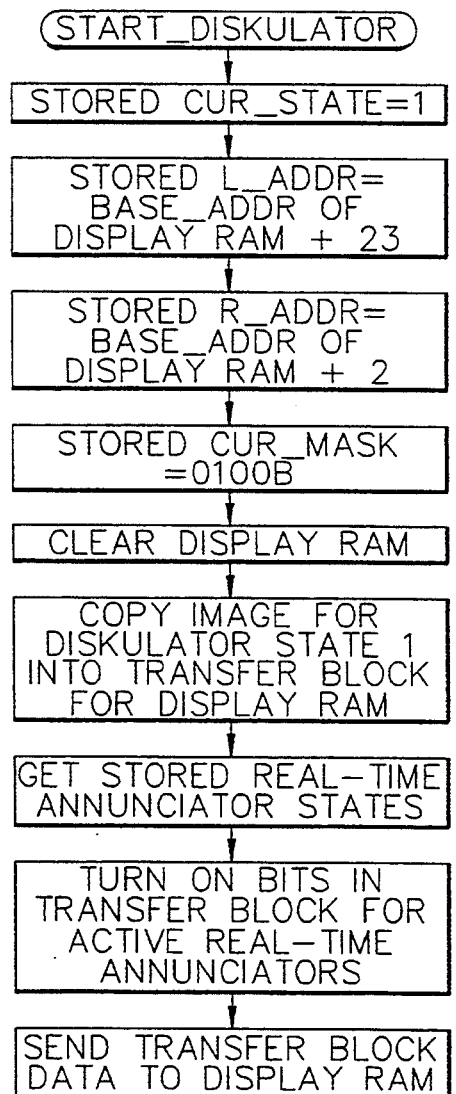
Figure 8:
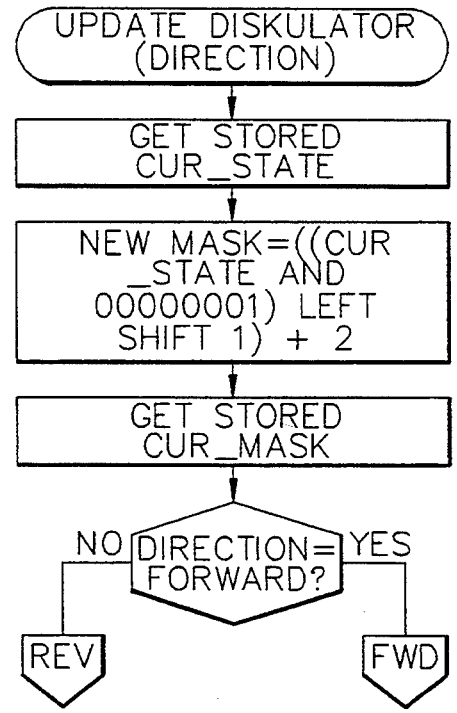
Figure 9:
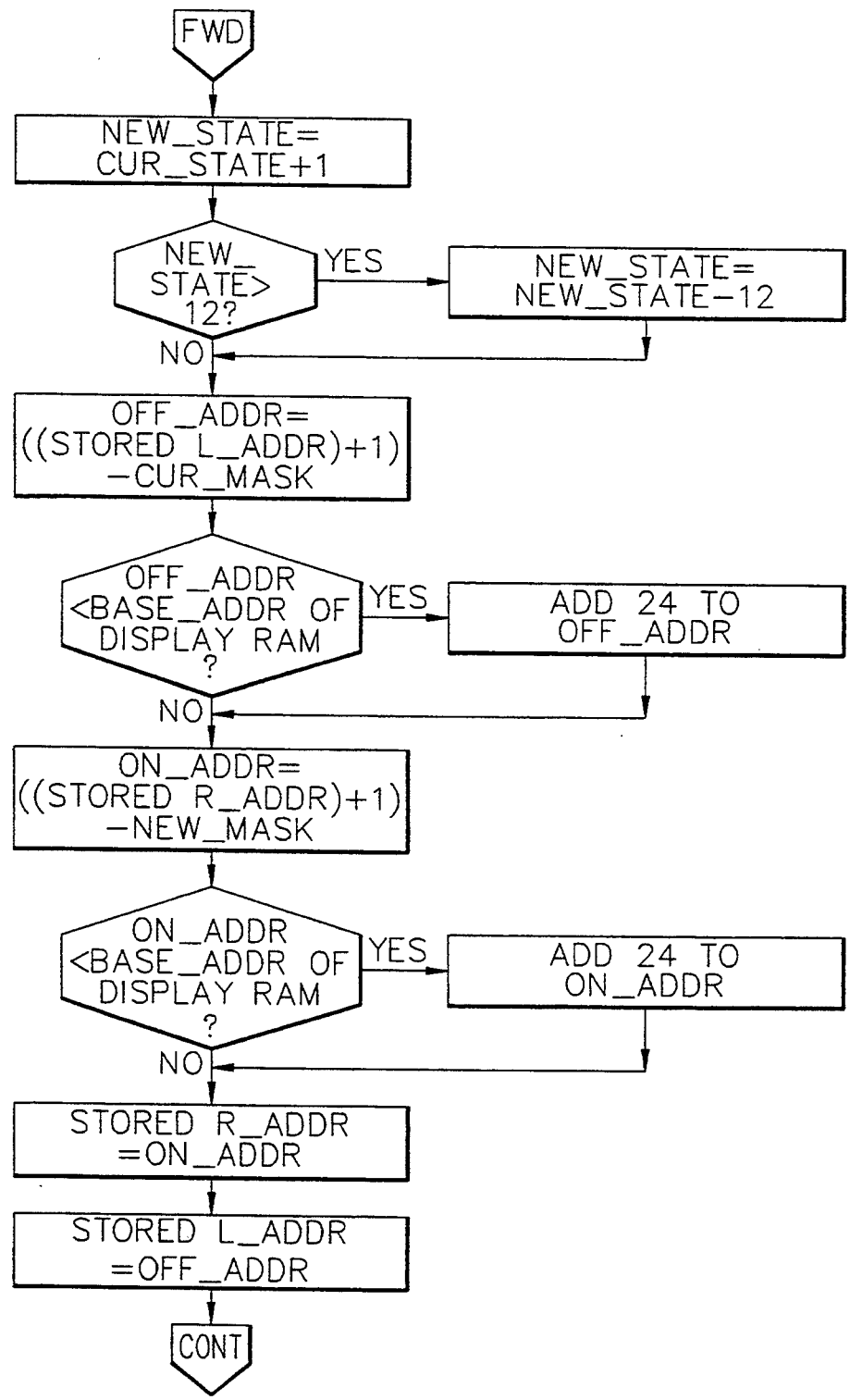
Figures 10, 11:
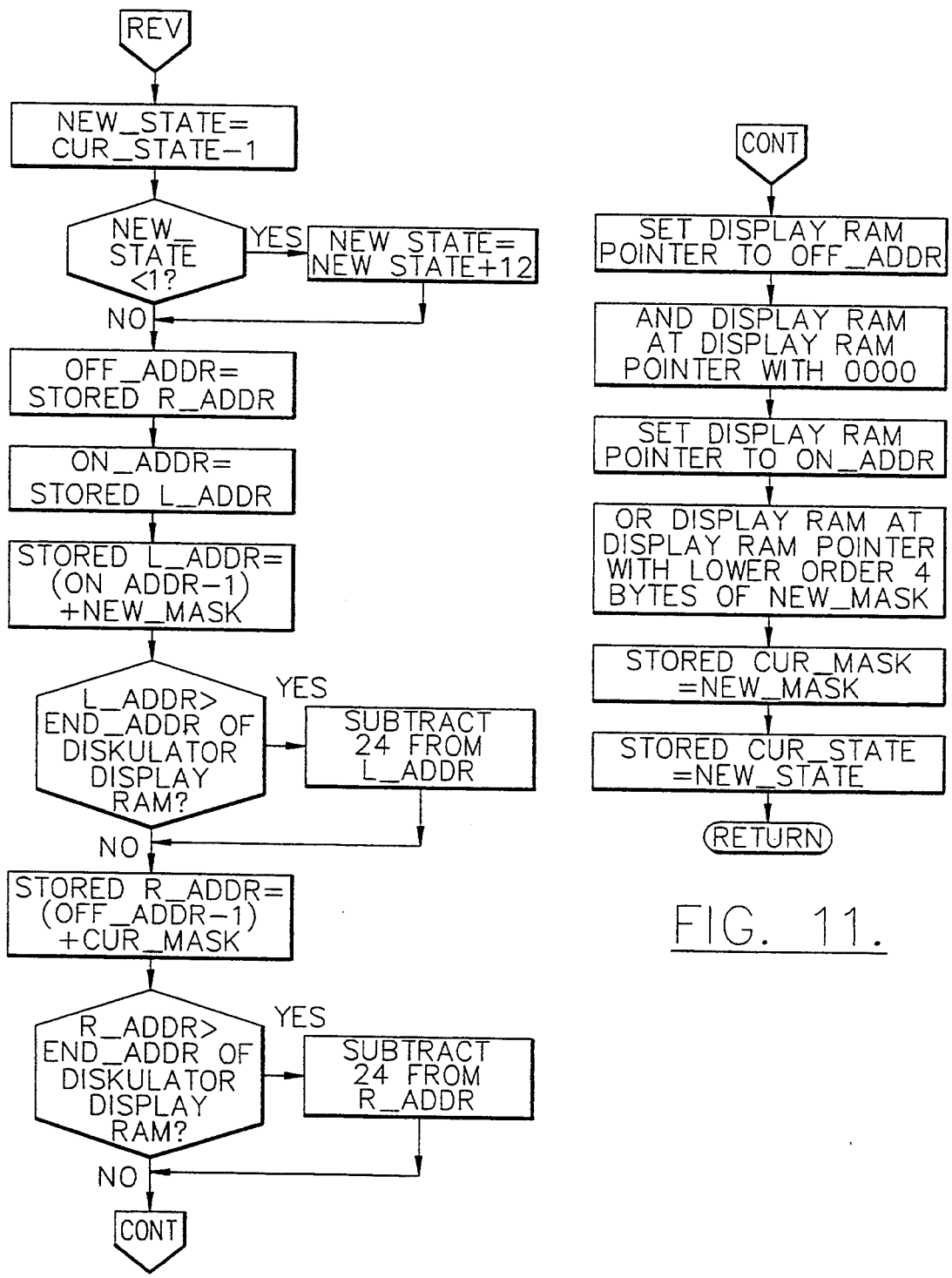

FIG. 7 is a flow chart for the software to start the simulator.

FIGS. 8–11 are flow charts for the software for updating the simulator.

FIG. 12 is the algorithm for the simulator.

Referring to FIG. 1, the liquid crystal display (LCD), including the 128 segment segmented display 2 mounted on the bezel 4 of the electronic electric power meter 5 includes a plurality of segments such as 6, 8, 10 and 12, for test and other purposes. The liquid crystal display 2 includes a plurality of segmented alpha-numeric display characters 20, 22, 24, 26, 28 and 30. Each of the display characters 20, 22, 24, 26, 28 and 30 includes 14 segments arranged as shown which can be selectively energized to illuminate and indicate, through various energized segment combinations, alphabetical and numeric displays. The alpha-numeric segmented display character 20 includes a horizontal top segment 32, a horizontal bottom segment 34, a left vertical upper segment 36, a left vertical lower segment 38, a right vertical upper segment 40 and a right vertical lower segment 42. The alpha-numeric segmented display character 20 also includes a central upper vertical segment 44, a central lower vertical segment 46, a lower 45° diagonal segment 48, an upper 45° diagonal segment 50, an upper 135° segment 52, and a lower 135° diagonal segment 54. As is well known in the art, by selectively illuminating various segments of the alpha-numeric segmented display, various letters and/or numerals may be caused to glow or be affected so as to present what appears to be letters or numerals. This is illustrated in FIG. 2.

Referring to FIG. 2, the display illustrated is "C35718." The letter C is formed in the alpha-numeric segmented display character 20 by the energization of the horizontal top segment 32, the left vertical upper segment 36, the left vertical lower segment 38, and the horizontal bottom segment 34. The numeral 3 shown displayed by the alpha-numeric segmented display character 22 is formed by energization of the horizontal top segment 32, the right vertical upper segment 40, the right vertical lower segment 42, the horizontal bottom segment 34, the central horizontal left half segment 60 and the central horizontal right half segment 62. Similarly, the numerals 5, 7, 1 and 8 as shown in the alpha-numeric segmented display characters 24, 26, 28 and 30, respectively, are provided by the selective energization of the proper segments of each of the 14 element segmented alpha-numeric displays as shown in FIG. 2.

In accordance with the present invention, the alpha-numeric segmented displays 20, 22, 24, 26, 28 and 30 are operated and energized in a conventional power indication mode to provide the various indications required of electric power meters including various test and display functions, such as, for example, the display of various time of use information in the case of time of use registers. In addition to, and in combination with, such conventional operation, a mode of operation is provided in which the central horizontal half segments 60 and 62 in each of the alpha-numeric segmented display characters 20, 22, 24, 26, 28 and 30 are utilized to provide a visual simulation of a rotating eddy current disk. This visual simulation can be initiated upon actuation of a proper switch such as button 15 of FIG. 6. The visual simulation is provided by a series of three dashes generated by the energization of the central horizontal half segments 60 and 62, which are caused to move across the 12 middle segments of the alpha-numeric LCD display 2, simulating the movement of the timing mark during rotation of an electro-mechanical eddy current disk. Twelve segments are used to correspond with the 12 pulses per revolution of the meter disk in a conventional electro-mechanical meter. The three dashes move from left to right when the real energy flow is in the positive direction corresponding with forward disk rotation of an eddy current disk, and from right to left when the real energy flow is in the negative direction corresponding to reverse disk rotation of an eddy current disk in a conventional induction watt hour meter. One complete cycle of the three dashes through the display simulates and represents one disk rotation.

In an electro-mechanical power meter, the eddy current disk rotates in a disk gap which is formed by the meter structure and which provides a magnetic field to interact with the eddy current disk in response to the power consumed by the load being metered. To visually simulate that disk gap, the six top and six bottom segments 32 and 34, respectively, of the alpha-numeric segmented display characters 20, 22, 24, 26, 28 and 30 are constantly energized during the eddy current disk rotation simulation mode of operation of the power meter.

The simulator of the present invention is implemented using, in a preferred embodiment, an NEC 7225 LCD controller integrated circuit 68 (see FIG. 6) configured for a quadruplexed display with the 6 14-segment alpha-numeric display characters 20, 22, 24, 26, 28 and 30 controlled by contiguous 7225 display random access memory (RAM) locations. The LCD controller 68 is capable of controlling up to 128 independent segments; however, the disk rotation simulator uses only a portion of these segments, namely 24 segments of the 6 alpha-numeric display characters 20, 22, 24, 26, 28 and 30. The NEC 7225 has a 32×4 bit display RAM which can be manipulated by use of command bytes written to the control port. Each bit of the display RAM controls a segment of the display. If a bit in the display RAM equals 1, its corresponding display segment will be energized, or "ON". If a bit in the display RAM equals 0, then its corresponding display segment will not be energized, or "OFF". The layout of the NEC LCD 7225 controller display RAM 70 is shown in FIG. 3.

Referring to FIG. 3, it is to be noted that all of the bits in the display RAM 70 are equal to 0 such that all of the segments of the alpha-numeric segmented display characters 20, 22, 24, 26, 28 and 30 will not be energized, and hence will be OFF. When the disk rotation simulator mode of operation is actuated, such as through pushbutton 15 of FIG. 6, the alpha-numeric LCD display assembly 14 switches from the display of alpha-numeric characters, such as those shown in FIG. 2, to the simulated eddy current disk rotation simulation mode of operation. In the eddy current disk rotation simulation mode, the display RAM addresses 0 through 23. Addresses 0 through 3 control the 14 segments plus the decimal point of the segmented display 30, while addresses 20 through 23 control the segments of the segmented character 20. Bit 0 of addresses 2, 6, 10, 14, 18 and 22 control the top segments of the characters. Bit 3 of addresses 1, 5, 9, 13, 17, and 21 control the bottom segments of the segmented characters 20, 22, 24, 26, 28 and 30. Since the top and bottom segments 32 and 34, respectively, of each segmented character are used to simulate the gap above and below the eddy current meter disk, they are always on during the simulation operation. Bit 1 of addresses 3, 7, 11, 15, 19 and 23 control the left middle segment 60 of the characters while bit 2 of addresses 0, 4, 8, 12, 16 and 20 control the right middle segments 62 of the segmented characters 20, 22, 24, 26, 28 and 30.

The left half central horizontal segment 60 and the right half central horizontal segment 62 of the segmented characters 20, 22, 24, 26, 28 and 30 are used to simulate the rotation of the eddy current disk. For each possible position, or state, the disk rotation simulation provides a combination of three adjacent central segments 60 and 62 energized to be ON. This provides 12 possible states for the simulation. FIG. 4 shows the memory contents of the NEC 7225 controller display RAM 68 for the 12 states, while FIG. 5 shows the 12 states as they appear displayed on the alpha-numeric display assembly 14 of the liquid crystal display 2.

Figure 5A:
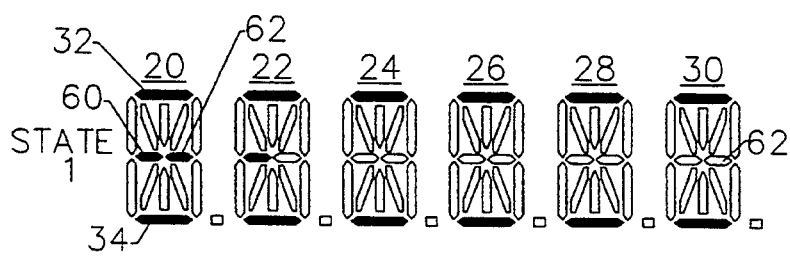
Figure 5B:
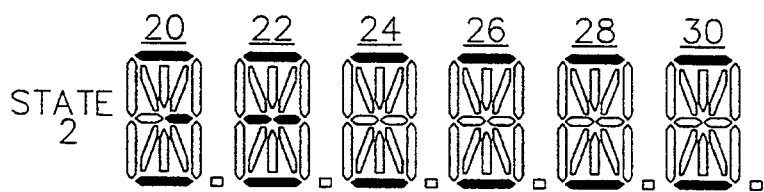
Figure 5C:
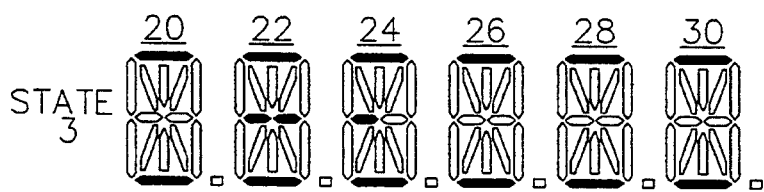
Figure 5D:
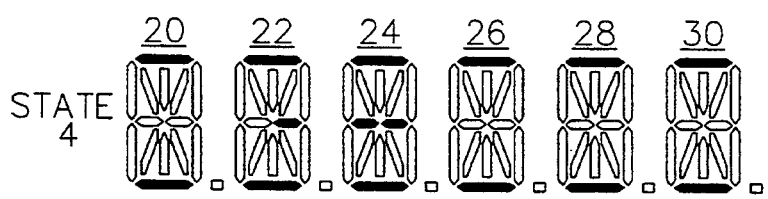
Figure 5E:
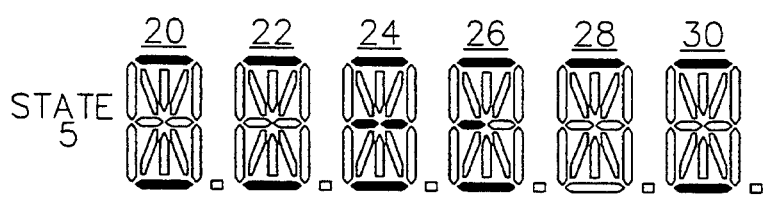
Figure 5F:
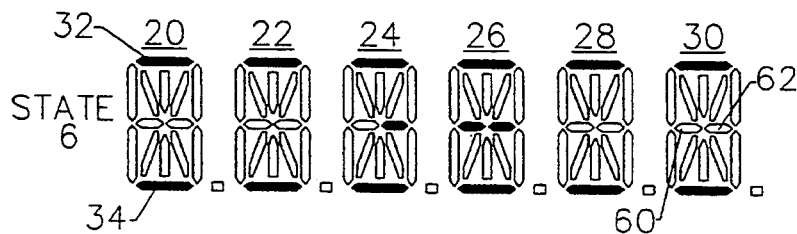
Figure 5G:
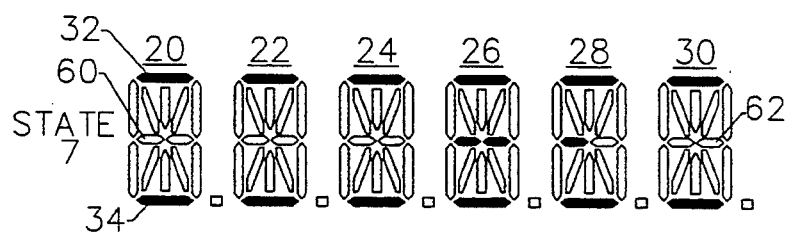
Figure 5H:
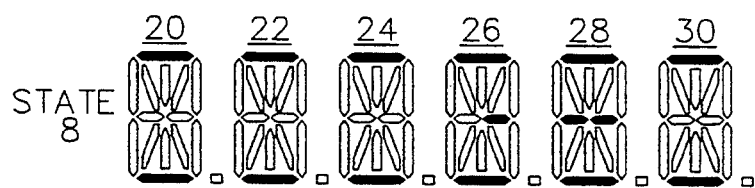
Figure 5I:
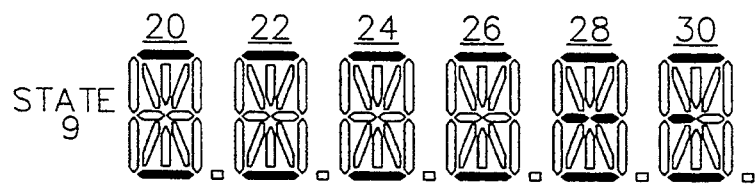
Figure 5J:
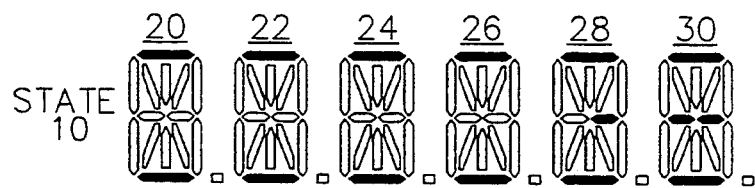

Referring to FIGS. 4 and 5, FIGS. 5(a) through 5(l) show the display provided by the segmented characters 20, 22, 24, 26, 28 and 30 in response to the corresponding 12 states provided by the memory of the NEC 7225 controller display RAM 70 as indicated in the corresponding FIGS. 4(a) through 4(l), respectively. It is to be noted that in FIG. 5(a) and also in FIGS. 5(b) through 5(l), the horizontal top segment 32 and the horizontal bottom segment 34 of all of the segmented characters 20, 22, 24, 26, 28 and 30 are energized, and hence are continuously illuminated to simulate the air gap in which an eddy current disk rotates. In FIG. 5(a), the central horizontal left half segment 60 and the central horizontal right half segment 62 of the segmented character 20 are both energized, and in the adjacent segmented character 22 the central horizontal left half segment 60 is energized, providing a series of three horizontal dashes in the central region extending across the segmented character 20 into the left half of the segmented character 22. In FIG. 5(b) the energization has been changed through LCD controller 70 such that only the right half segment 62 of the segmented character 20 remains energized, while both halves, the left half segment 60 and the right half segment 62, of the segmented character 22 are energized such that the series of three dashes has moved by one half of a segmented character to the right. Similarly, in FIG. 5(c), or state 3 shown in FIG. 4(c), both the left and right half of the segmented character 22 are energized while the left half of segmented character 24 is energized, such that the series of three dashes has again moved one half of a segmented character to the right from that shown in FIG. 5(b). Similarly in FIGS. 5(d) through 5(j), the sequence of three dashes move successively one half segment to the right in each successive state until the three dashes occupy the right half of segmented character 28 and completely fill segmented character 30. As such, the three dashes are at the extreme end of the right hand side of the alpha-numeric display assembly 14.

Figure 5K:
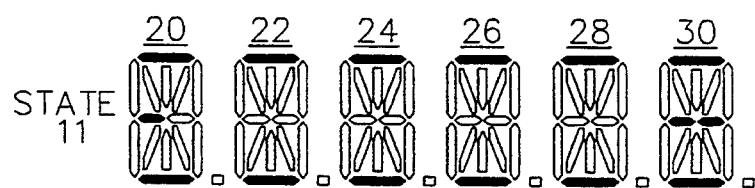
Figure 5L:
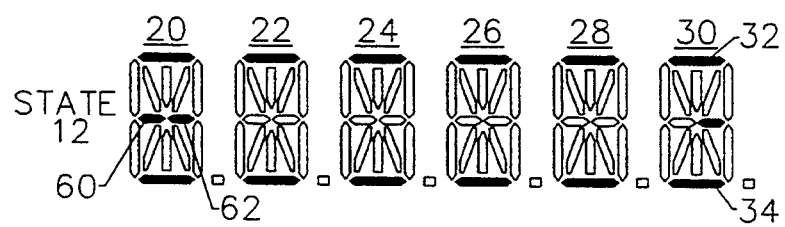

As an eddy current disk in a conventional electro-mechanical induction watt hour meter rotates, the timing mark which is on the outer end, or circumference, of the disk moves from one end of the disk gap to the other end of the disk gap where the timing mark disappears as it rotates around the back, or the interior of, the power meter. It subsequently reappears on the opposite end of the gap after it has completed the rotation around the interior rear portion of the power meter. This is visually simulated in the present invention as shown in FIGS. 5(k) and 5(l). Referring to FIG. 5(k), or state 11, both the left half segment 60 and the right half segment 62 of the segmented character 30 are energized providing two dashes on the right of the LCD display 14 while the left half segment 60 of the segmented character 20 is simultaneously energized providing one dash on the left end of the LCD display. This presents a visual "wrap around" of the three dashes. Referring next to FIG. 5(l), it is seen that in the further "rotation" or movement of the three dashes to the right, the single right half segment 62 of the segmented character 30 is energized, while the entire or both segments 60 and 62 of the segmented character 20 are energized presenting further wrap around. The next state is state 1, shown in FIG. 5(n) which was the beginning of the rotation described in connection with FIG. 5 and in which the wrap around is complete.

As a result, the three dashes shown in FIG. 5 move from left to right indicating real energy flow in the positive direction (or forward disk rotation), and wrap around the end of the gap (defined by the horizontal top segments 32 and horizontal bottom segments 34 of the segmented characters 20, 22, 24, 26, 28 and 30) to simulate rotation of an eddy current disk in a conventional electro-mechanical power meter. The 12 horizontal segments 60 and 62 correspond with the 12 pulses per revolution of the eddy current meter disk in a conventional electro-mechanical meter.

FIG. 6 is a block diagram showing the interconnection of the relevant portions of the register of the electronic electric power meter 3. Referring to FIG. 6, the electronic electric power meter 3 includes a microprocessor 66 which measures pulses responsive to the power being consumed by the load being metered. The microprocessor 66 is connected through the LCD controller 68 for the power display mode of operation with display of power consumption and test information on the LCD display assembly 14. Actuation of pushbutton display switch 15 grounds out the 5 volt signal to microprocessor 66, discontinuing the display of power consumption information and actuating the LCD controller 68, including display RAM 70, to display the eddy current disk rotation simulation on LCD display assembly 14.

The flow charts of FIGS. 7-11 show the control of the simulation mode, with FIG. 7 being the flow chart for the software to start the simulator and FIGS. 8-11 showing the flow charts for updating the simulator. FIG. 12 sets forth the algorithm for the simulator. Referring to FIGS. 7-12, in which the disk rotation simulator is referred to as the "diskulator", the current state of the diskulator gives its position and is saved in a static variable called cur_state. The cur_state may assume values from 1 to 12. Segments such as 32, 34, 60 and 62 of the segmented displays 20, 22, 24, 26, 28 and 30 are turned on by sending an "OR" data command to the LCD display controller 68. Segments are turned off by sending an "AND" data command to the LCD display controller 68. Since there are no other segments to worry about in the same display RAM address as the segment to turn off, the data for the "AND" command can always be 0000B. ANDing a location with this data will always result in all 4 segments controlled by that address being turned off. Turning on a right middle segment requires an "OR" of the display RAM with 0100B. Turning on a left middle segment requires an "OR" of the display RAM with 0010B. The value of the data to send with the "OR" command is calculated from the current diskulator state by the diskulator algorithm of FIG. 12 and is kept in the volatile variable new_mask.

Commands to the LCD display controller 68 are performed on the display RAM address currently pointed to by an internal display RAM pointer of the controller. This pointer may be set with a "SET DISPLAY POINTER to address" command to the controller, where 0<address<32. The address for the segment to turn off is calculated by the diskulator algorithm of FIG. 12 and is kept in the volatile variable off_addr. The address for the segment to turn on is calculated by the diskulator algorithm and is kept in the volatile variable on_addr. To compute these volatile variables efficiently, each time the diskulator is updated, the static variables cur_mask, cur_state, L_addr, and R_addr are saved. Each time the diskulator is updated, these variables are available from the previous update.

In forward operation, at the end of the update, cur_mask represent the data used to "OR" the new segment on, cur_state represents the current position of the diskulator after the update, L_addr represents the address controlling the segment that was turned off, and R_addr represents the address controlling the segment that was turned on. When operating in reverse, the values are treated as though the last update had a forward direction. When the values are saved, they are saved as though the current position were reached from an update in the forward direction. Thus, the saved values associated with any state are the same whether the state was reached by a forward or reverse motion.

We have thus provided simulated meter disk or meter timing mark rotation which is realistic and enables timing and testing of an electronic power meter utilizing existing and standard test procedures and test equipment designed for use with electro-mechanical power meters which have a rotating eddy current disk and timing mark. This minimizes the training required of personnel familiar with existing test procedures. Moreover, the simulation utilizes, on a time sharing basis, existing alpha-numeric liquid crystal displays without the necessity of special displays or special display manufacturing requirements or masks. The simulated display approximates the rotating eddy current disk of an electro-mechanical power meter, and visually displays the direction of rotation and energy flow. Significantly, the invention imposes a minimum burden on the timing and space limitations of the software available in the microprocessor of the electronic power meter.

While the present invention has been described with respect to certain preferred embodiments thereof, it is to be understood that numerous variations in the details of construction, the arrangement and combination of parts, and the type of materials used may be made without departing from the spirit and scope of the invention.

What we claim is:

1. A method of simulating the motion of a rotatable disk utilized in electro-mechanical power meters in an electronic power meter provided with a plurality of segmented characters comprising the steps of:

displaying power consumption information responsive to the power being consumed by a load in circuit with said electronic power meter on said segmented characters;

interrupting the display of said power consumption information and providing a simulated disk rotation display on said segmented characters;

providing a command signal responsive to pulses of said electronic power meter which vary in accordance with said power consumption;

generating horizontal display segments extending beyond a single segmented character which move across said segmented characters in response to said command signal with said horizontal display segments disappearing in part at one end of said segmented characters, while at the same time appearing in part at the opposite side of said segmented characters to visually simulate the wrap around of said horizontal display segments;

whereby movement of said horizontal display segments visually simulates the rotation of a rotatable disk in response to the power being metered.

2. The method of claim 1 including the additional step of energizing the top and bottom horizontal segments of said segmented characters during the period when said simulated disk rotation is displayed to provide a pair of substantially parallel lines within which said substantially horizontal display segment moves, to thereby further simulate the gap in an electro-mechanical power meter in which said rotatable disk rotates.

3. The method of claim 1 wherein said segmented characters each include an intermediate segment in two parts, and movement of said horizontal display segments being accomplished by energizing the two parts of one of said segmented characters, while at the same time energizing only one part of an adjacent segmented character.

4. The method of claim 3 wherein said horizontal display segments are caused to move by discontinuing the energization of one part of an adjacent segmented character while commencing the energization of one part of the segmented character on the opposite side from said one part of a segmented character.

5. The method of claim 2 wherein said plurality of segmented characters comprises 6 segmented characters in a 128 segment display, each segmented character including an intermediate horizontal segment of 2 parts, and said generating of horizontal display segments comprises the energization of 3 of the intermediate parts of 2 adjacent segmented characters.

6. The method of claim 5 including the additional steps of detecting the direction of energy flow relative to the load, and moving said horizontal display segments in a direction responsive to the direction of energy flow.

7. The method of claim 5 including the additional step of counting the number of times said segmented characters move through said gap and wrap around to return to a given position over a period of time as part of the testing of the operation of said electronic power meter, thereby simulating the use of a timing mark on the meter disk in a conventional power meter for counting and timing purposes.

8. The method of claim 7 including the additional step of time sharing said segmented character display to display said power consumption information, and at a different time to display the simulated rotatable disk.

9. The method of claim 1 including the additional step of time sharing said segmented characters display to display said power consumption information, and at a different time to display the simulated rotatable disk on a programmed basis.

10. The method of claim 5 wherein the 12 pulses per revolution of the meter disk in a conventional power meter is simulated at least in part by the 12 horizontal segments of said 6 segmented characters, and generating 12 different states of said command signal.

* * * * *